United States Patent
Komatsu et al.

(10) Patent No.: US 11,789,365 B2
(45) Date of Patent: Oct. 17, 2023

(54) SUBSTRATE PROCESSING METHOD AND SUBSTRATE PROCESSING APPARATUS

(71) Applicant: KIOXIA CORPORATION, Tokyo (JP)

(72) Inventors: Ryu Komatsu, Atsugi Kanagawa (JP); Takeharu Motokawa, Zushi Kanagawa (JP); Noriko Sakurai, Yokohama Kanagawa (JP); Hideaki Sakurai, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 424 days.

(21) Appl. No.: 16/804,981

(22) Filed: Feb. 28, 2020

(65) Prior Publication Data

US 2021/0080831 A1    Mar. 18, 2021

(30) Foreign Application Priority Data

Sep. 17, 2019   (JP) ................ 2019-168735

(51) Int. Cl.
| | |
|---|---|
| *G03F 7/20* | (2006.01) |
| *H01L 21/027* | (2006.01) |
| *G03F 7/00* | (2006.01) |
| *G03F 7/38* | (2006.01) |
| *G03F 7/16* | (2006.01) |

(52) U.S. Cl.
CPC ............ *G03F 7/2041* (2013.01); *G03F 7/162* (2013.01); *G03F 7/2004* (2013.01); *G03F 7/38* (2013.01); *G03F 7/70341* (2013.01); *H01L 21/0271* (2013.01)

(58) Field of Classification Search
CPC ........ G03F 7/2041; G03F 7/2024; G03F 7/40; G03F 7/70341
See application file for complete search history.

(56) References Cited

U.S. PATENT DOCUMENTS

| | | | | |
|---|---|---|---|---|
| 5,843,627 | A  * | 12/1998 | Bok ....................... | G03F 7/3021 134/33 |
| 7,364,839 | B2 * | 4/2008 | Hayasaki .................. | G03F 7/40 430/322 |
| 2006/0162858 | A1* | 7/2006 | Akimoto ............. | H01L 21/6715 156/272.8 |
| 2007/0287100 | A1* | 12/2007 | Mizutani ............. | G03F 7/70383 430/311 |
| 2011/0244197 | A1* | 10/2011 | Takemura ............. | G03F 7/0392 430/326 |
| 2012/0034558 | A1* | 2/2012 | Chang ................... | G03F 7/0046 430/322 |

FOREIGN PATENT DOCUMENTS

| | | |
|---|---|---|
| JP | 2009-280432 A | 12/2009 |
| JP | 2016-171189 A | 9/2016 |
| JP | 2017-168789 A | 9/2017 |
| JP | 2018-120967 A | 8/2018 |

* cited by examiner

*Primary Examiner* — Daborah Chacko-Davis
(74) *Attorney, Agent, or Firm* — Kim & Stewart LLP

(57) ABSTRACT

A method for processing a substrate includes forming a pattern on a substrate, supplying water to cover the pattern, and after the supplying the water, irradiating the pattern with light having a wavelength longer that which causes dissociation of water. A substrate processing apparatus of an embodiment includes a transfer chamber to receive a patterned substrate, a water supplying chamber to cover the pattern with water, and an irradiating chamber to irradiate a portion of the pattern with near-field light.

26 Claims, 6 Drawing Sheets

RMS: Root Mean Square

RMS: Root Mean Square

SUBSTRATE PROCESSING METHOD AND SUBSTRATE PROCESSING APPARATUS

CROSS-REFERENCE TO RELATED APPLICATION(S)

This application is based upon and claims the benefit of priority from Japanese Patent Application No. 2019-168735, filed on Sep. 17, 2019, the entire contents of which are incorporated herein by reference.

FIELD

Embodiments described herein relate generally to a substrate processing method and a substrate processing apparatus.

BACKGROUND

In various aspects of a semiconductor manufacturing process, a pattern is formed in various materials. It is desirable to reduce line edge roughness (LER) of such patterns. LER may be feature edge roughness, or variations in a width, of a line/feature/pattern element along the length direction of the pattern portion or line/feature/pattern element in the pattern.

DETAILED DESCRIPTION

Figure 1:
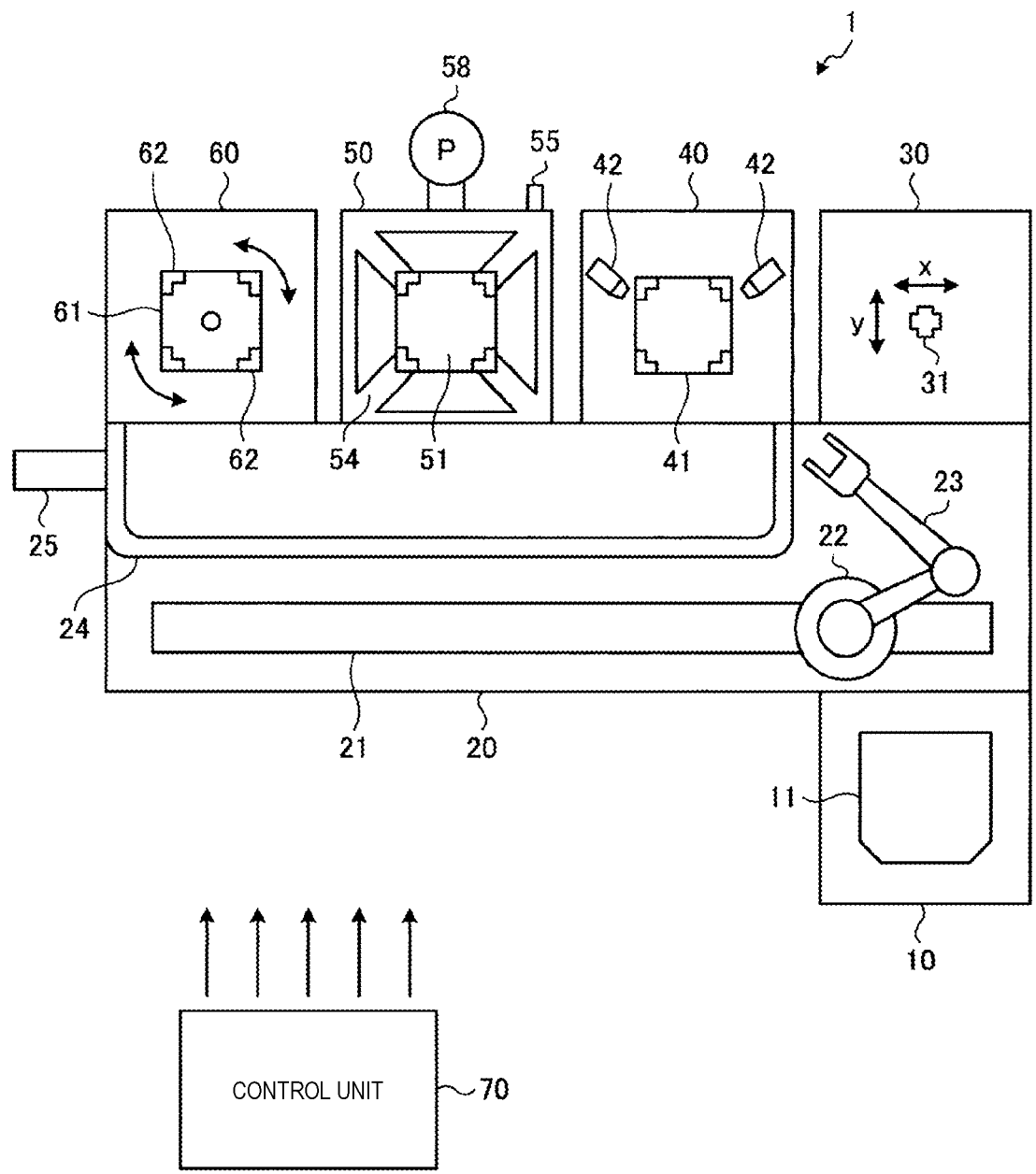
FIG. 1 illustrates a top cross-sectional view of an example of a configuration of a substrate processing apparatus according to an embodiment.

One or more embodiments provide a substrate processing method and a substrate processing apparatus that are directed to reducing LER of a pattern.

In general, according to an embodiment, a method for processing a substrate includes forming a pattern on a substrate, supplying water to cover the pattern, and after the supplying the water, irradiating a portion of the pattern with a light having a wavelength longer than a wavelength that causes dissociation of water.

Hereinafter, the present disclosure will be described with reference to the drawings. The present disclosure is not limited to the following example embodiment. In addition, aspects in the following disclosure include such variations and modifications that would be apparent or suggested to those that those of ordinary skill in the art from the present disclosure.

EMBODIMENT

In manufacturing a semiconductor, a fine resist pattern may be formed. One example is a manufacturing process of a template used for imprint processing. In the imprint processing, a fine pattern formed on the template is transferred to a resist film on a wafer, and the wafer is processed using the resist film as a mask to obtain the fine pattern. In order to manufacture such a template, a resist pattern is formed on a substrate of quartz or the like by, for example, electron beam drawing, and the substrate is processed using the resist pattern as a mask.

In a fine resist pattern as found in template manufacturing, even nano-scale roughness due to the unevenness of a surface of the resist pattern may adversely affect subsequent processes. For example, adjacent patterns may be connected to each other or the patterns may be interrupted due to aberrations in line edge roughness (LER), which is the roughness along an extending (length) direction of the resist pattern portion. When such unevenness/roughness is transferred to, for example, a wiring pattern of a semiconductor device, an open defect may occur due to a short-circuit defect or a disconnection.

A technique using near-field light for reducing the nano-level roughness of a quartz member, substrate, template, plate or the like is known.

The near-field light is light generated locally around a structure that is smaller than a wavelength of light used to irradiated the structure. The near-field light has higher energy than incident light in the vicinity of the structure, and the intensity of the near-field light decreases exponentially according to a distance from a surface of the structure. By using the above property, the near-field light is generated on a convex (protruding) portion of the quartz member (or the like), a reactive substance in the vicinity of the convex portion is activated by the light energy, and the convex portion can be removed by a chemical reaction to achieve planarization of the quartz member (or the like). The reactive substances include oxygen gas, chlorine-based gas, solutions of chlorine and the like, hypochlorous acid water, hydrogen peroxide solution, aqueous solution of potassium iodide and iodine, polar solution of polar group and halogen, and the like.

The embodiment relates to a technique for planarizing a resist pattern with near-field light using water such as purified water or deionized water, which has low reactivity.

(Configuration Example of Substrate Processing Apparatus)

FIG. 1 illustrates a top cross-sectional view of an example of a configuration of a substrate processing apparatus 1 according to the embodiment. The substrate processing apparatus 1 is configured as an apparatus that performs processing for reducing the LER of the resist pattern using, for example, the near-field light. Water may be used as a liquid to react with the resist pattern. In the substrate processing apparatus 1, it is preferable to use purified water, ultra-purified water or the like, which has higher purity, in order to prevent contamination to the resist pattern and the like. Purified water used in the substrate processing apparatus 1 may be partially carbonated water having a specific resistance value at 23° C. that is adjusted to 0.1 MΩcm or more and 1.0 MΩcm or less by adding, for example, carbon dioxide in a slight amount.

As shown in FIG. 1, the substrate processing apparatus includes a cassette unit 10, a transfer unit 20, an alignment chamber 30, a purified water supply unit 40, a light irradiation unit 50, and a drying unit 60. The cassette unit 10, the alignment chamber 30, the purified water supply unit 40, the light irradiation unit 50, and the drying unit 60 are provided on both sides of the transfer unit 20.

The cassette unit 10 is used as a carry in and out unit is configured such that a storage container 11 containing a substrate of quartz or the like can be placed thereon, and the substrate can then be moved in and out back and forth between the placed storage container 11 and the substrate processing apparatus 1. A fine resist pattern has already been formed on the substrate(s) stored in the storage container 11.

The transfer unit 20 comprises a transfer chamber and is configured to permit the transfer of the substrate between the respective units in the substrate processing apparatus 1. In the transfer unit 20, a transfer robot 22 including a transfer arm 23 can be provided. The transfer robot 22 is mounted on a rail 21 that longitudinally traverse through the transfer unit 20 and is configured to be able to longitudinally traverse through the transfer unit 20. The transfer robot 22 can move to each unit position, and can carry the substrate into and out of each unit using the transfer arm 23.

In addition, a tray 24 is provided on a floor at a position of the transfer unit 20 corresponding to the purified water supply unit 40, the light irradiation unit 50, and the drying unit 60. A discharge pipe 25 communicating with an outside of the transfer unit 20 is connected to the tray 24. As described below, between the purified water supply unit 40, the light irradiation unit 50, and the drying unit 60 are transfer paths for transferring the substrate which is supplied with purified water. For this reason, purified water spilled from the substrate is quickly discharged out of the substrate processing apparatus 1.

The transfer unit 20 may include a receiving saucer connected to a drain tube below the transfer arm 23 instead of or in addition to the tray 24 and the discharge pipe 25.

The transfer unit 20 may include a mechanism that supplies purified water to the substrate being transferred in order to prevent drying of the substrate being transferred due to purified water spilling from the substrate.

The alignment chamber 30 is configured to be able to align the substrate. The alignment chamber 30 includes a stage 31 on which the substrate is placed. The stage 31 is configured to be drivable in the depicted vertical and horizontal page directions of FIG. 1, that is, in an X direction and a Y direction orthogonal to the X direction in a plane of the stage 31.

In addition, the alignment chamber 30 is provided with an irradiation device (not separately depicted) that supplies laser light or the like in an upper-lower direction of the alignment chamber 30. The stage 31 on which the substrate is placed can identify and align an outer edge portion of the substrate based on reflection light or the like from the substrate generated from the laser light from the irradiation device.

The purified water supply unit 40 includes a first processing chamber and is configured to be able to supply purified water to the resist pattern formed on the substrate. The purified water supply unit 40 includes a hot plate 41 on which the substrate is placed and a nozzle 42 that can supply purified water to the substrate on the hot plate 41.

The hot plate 41 may adjust a temperature of the substrate to, for example, 25° C. or more and 80° C. or less. The nozzle 42 is connected to one end of a supply pipe (not shown) capable of supplying purified water. The other end of the supply pipe is, for example, connected to a tank (not shown) in which purified water is stored. The tank is, for example, provided on the outside of the substrate processing apparatus 1. For example, heaters are provided in the supply pipe and the tank, and may be configured such that the temperature of purified water supplied to the substrate can be adjusted.

The purified water supply unit 40 may include an immersion tank in which purified water is stored instead of the nozzle 42. The substrate carried into the purified water supply unit 40 is immersed in the immersion tank, and then placed on the above hot plate 41 to be adjusted to an appropriate temperature.

With any of the above configurations, purified water is supplied to the substrate on which the resist pattern is formed until the purified water covers the entire surface of the substrate due to surface tension or the like. Such a state may be referred to as a liquid covered state.

The substrate in a liquid covered state is transferred to the light irradiation unit 50 by the transfer unit 20 described above. The purified water supply unit 40 or the transfer unit 20 may include a mechanism that arranges a configuration such as a dummy substrate on one side of the substrate facing a purified water supply surface when the substrate in the liquid covered state is transferred. Since purified water in the liquid covered state is in a state of being sandwiched between the substrate and the configuration facing the substrate, it is possible to prevent the purified water from spilling out from the substrate. In addition, the drying of the substrate during transfer can also be prevented.

The light irradiation unit 50 as a second processing chamber is configured to be able to irradiate the substrate supplied with purified water with light. In addition, the light irradiation unit 50 includes a pump 58 and is configured to be able to adjust a pressure in the light irradiation unit 50. Details of these configurations will be described below.

The light irradiation unit 50 includes a stage 51 on which the substrate is placed. Around the stage 51, discharge paths 54 that discharge purified water spilled from the substrate are provided radially in a manner centered on the stage 51. A discharge pipe 55 communicating with an outside of the light irradiation unit 50 is connected to the discharge paths 54.

The drying unit 60 as a third processing chamber is configured to be able to dry the substrate supplied with purified water. The drying unit 60 includes a spinner 61 including a chuck 62 for fixing the substrate. The substrate placed on the spinner 61 and fixed by the chuck 62 is spin-dried by the spinner 61 spinning at a high speed. Purified water scattered from the substrate SB is recovered by a recovery mechanism (not shown) provided in the drying unit 60.

The drying unit 60 may include a mechanism that blows gas such as dry air onto the substrate instead of or in addition to spin-drying.

A chuck for fixing the substrate may be provided on at least one of the hot plate 41 of the purified water supply unit 40 and the stage 51 of the light irradiation unit 50.

A control unit 70 controls each unit of the substrate processing apparatus 1. That is, the control unit 70 controls the transfer robot 22 and the transfer arm 23 of the transfer unit 20 to transfer the substrate between the units. In addition, the control unit 70 controls the stage 31 and the irradiation device of the alignment chamber 30 to align the substrate. In addition, the control unit 70 controls the hot plate 41 and the nozzle 42 of the purified water supply unit 40 to supply purified water to the substrate while adjusting the temperature of the substrate. In addition, the control unit 70 controls each unit of the light irradiation unit 50 to irradiate the substrate with the light while adjusting the pressure in the light irradiation unit 50. In addition, the control unit 70 controls the spinner 61 and the chuck 62 of the drying unit 60 to rotate the spinner 61 and dry the substrate while fixing the substrate on the spinner 61 with the chuck 62.

(Configuration Example of Light Irradiation Unit)

Figure 2:
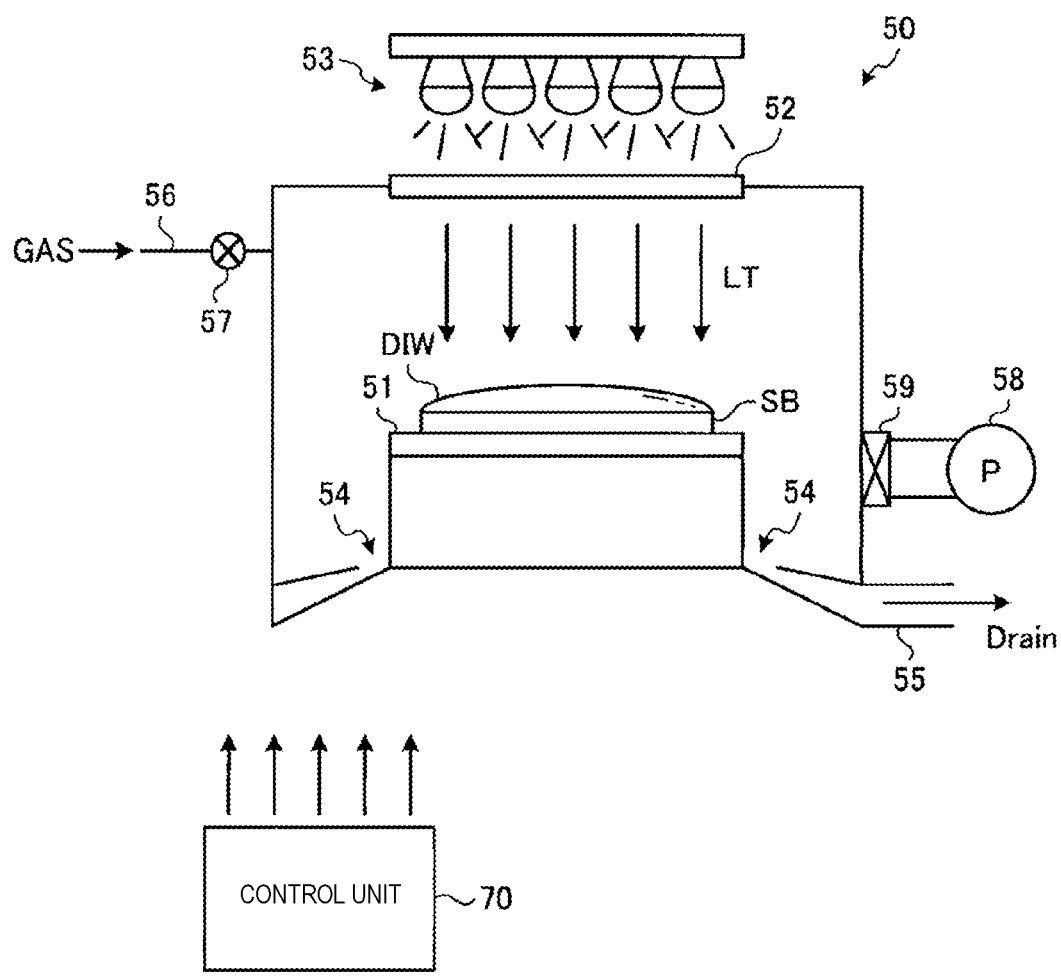
FIG. 2 illustrates a side cross-sectional view an example of a configuration of a light irradiation unit according to an embodiment.

Next, a detailed configuration example of the light irradiation unit 50 of the substrate processing apparatus 1 will be described with reference to FIG. 2. FIG. 2 illustrates a side cross-sectional view of an example of a configuration of the light irradiation unit 50 according to the embodiment.

As shown in FIG. 2, the light irradiation unit 50 is configured as a sealed container capable of adjusting the pressure in the light irradiation unit 50. A gas supply pipe 56 provided with a valve 57 is connected to one side wall of the light irradiation unit 50. A pump 58 is connected to the other side wall of the light irradiation unit 50 through a butterfly valve 59 or the like, and can exhaust an atmosphere in the light irradiation unit 50.

The gas supply pipe 56 may be provided with a flow rate adjusting device such as a needle valve or a mass flow controller. A gas cylinder (not shown) is connected to the other end of the gas supply pipe 56, and a predetermined gas can be supplied into the light irradiation unit 50.

The predetermined gas is preferably a gas that does not dissociate unless irradiated with light having a wavelength shorter than a wavelength of light irradiated from an illumination device 53 described below. That is, a gas that is not dissociated by energy of the light irradiated from the illumination device 53 is preferable. Specifically, for example, oxygen, nitrogen, carbon monoxide, carbon dioxide, and nitrogen oxide may be used as the predetermined gas.

By adjusting a supply amount of the gas supplied into the light irradiation unit 50 and an exhaust amount of the pump 58 with the butterfly valve 59, the pressure in the light irradiation unit 50 can be adjusted. The pressure in the light irradiation unit 50 is preferably set to, for example, about several pascals to several tens of pascals.

The stage 51 on which the substrate SB is placed is disposed in a central portion of the light irradiation unit 50. Similarly to the hot plate 41 of the purified water supply unit 40, the stage 51 may be configured to be able to adjust the temperature of the substrate SB to, for example, 25° C. or more and 80° C. or less.

A window 52 is disposed on a position on an upper surface of the light irradiation unit 50 that faces the stage 51. The illumination device 53 as an irradiation unit, such as an LED, is disposed outside the light irradiation unit 50 and above the window 52. Light LT irradiated from the illumination device 53 may be white light source (e.g., a broadband source) or laser light. A wavelength of the laser light is preferably, for example, a wavelength longer than 258 nm, which is a wavelength that dissociates O—H bonds of purified water. That is, the illumination device 53 preferably emits a light LT having a wavelength that does not dissociate the purified water.

The light LT from the illumination device 53 passes through the window 52 on the upper surface of the light irradiation unit 50 and is irradiated onto the substrate SB placed on the stage 51. Here, when, for example, white light is used as the light LT from the illumination device 53, the illuminance may be 15,000 lux or more, preferably 22,500 lux or more, for example, 30,000 lux at a distance of, for example, 50 cm. At this time, the illuminance may be increased using a Fresnel lens (not shown).

The light irradiation unit 50 may include an illumination device on the stage 51 side instead of or in addition to the window 52 on the upper surface of the light irradiation unit 50 and the illumination device 53. Since the substrate SB of quartz or the like used for the template is transparent, it is possible to irradiate the light from a back surface of one side where the resist pattern is provided.

With the above configuration, the near-field light is generated at the convex portion of the resist pattern formed on the substrate SB, and the LER of the resist pattern is reduced. Details will be described below.

The floor of the light irradiation unit 50, for example, includes a center part where the stage 51 is disposed is the highest, and includes slopes that are lower toward the side wall sides of the light irradiation unit 50. On the floor of the light irradiation unit 50 inclined in this way, for example, the discharge paths 54 that discharge purified water DIW spilled from the substrate SB are provided. The discharge paths 54 are connected to the discharge pipe 55 communicating with the outside of the light irradiation unit 50.

According to the discharge paths 54 communicating with the outside of the light irradiation unit 50, for example, even if the purified water DIW spills from the substrate SB into the light irradiation unit 50, the purified water DIW can be quickly discharged from the light irradiation unit 50, and the pressure in the light irradiation unit 50 can be kept constant.

The control unit 70 controls each unit of the light irradiation unit 50. That is, the control unit 70 controls the valve 57 provided in the gas supply pipe 56 to supply the predetermined gas into the light irradiation unit 50. In addition, the control unit 70 controls the pump 58 and the butterfly valve 59 to exhaust the atmosphere in the light irradiation unit 50. In addition, the control unit 70 controls the illumination device 53 to irradiate the substrate placed on the stage 51 with the light LT.

(Mechanism)

Figure 3A:
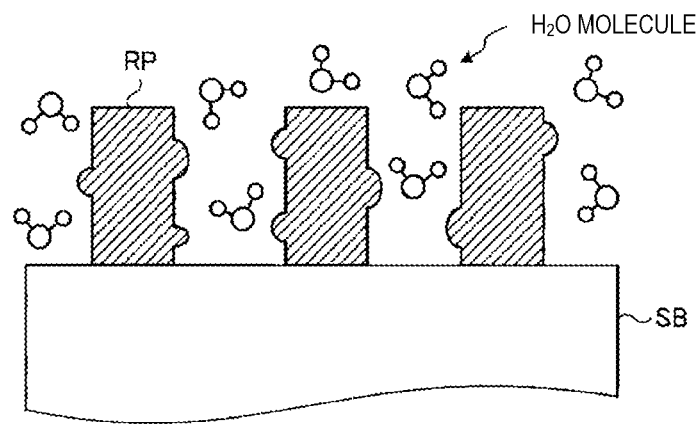
FIGS. 3A to 3C are diagrams schematically illustrating a mechanism that removes a convex portion of a resist pattern by using near-field light according to an embodiment.
Figure 3B:
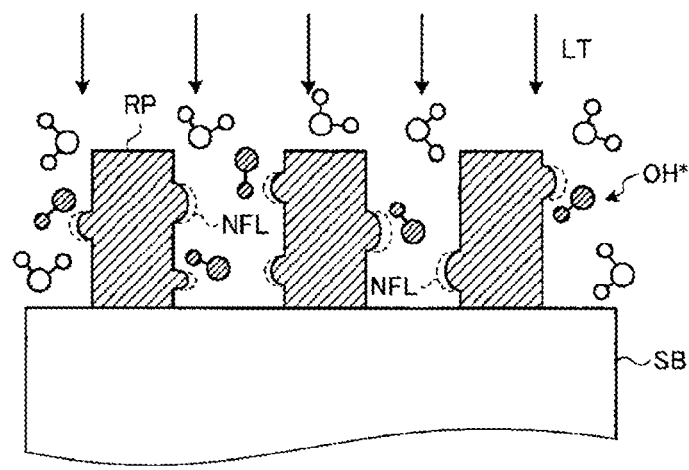
Figure 3C:
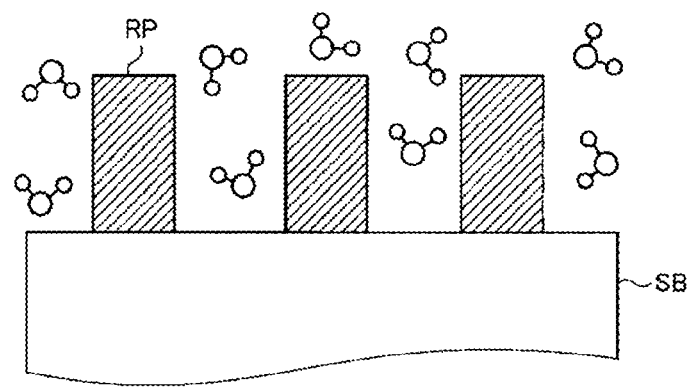

Next, a mechanism that reduces the LER of the resist pattern RP by using the near-field light will be described with reference to FIGS. 3A to 3C. FIGS. 3A to 3C are diagrams schematically showing the mechanism that removes the convex portion of the resist pattern RP by using the near-field light according to the embodiment.

The resist pattern RP shown in FIGS. 3A to 3C are formed using the electron beam drawing on the substrate SB of quartz or the like. The resist pattern RP has a nano-level fine unevenness caused by a resist material or the electron beam drawing.

Here, the resist pattern RP may be a linear pattern such as a line-and-space, or may be a dot pattern or a pattern having holes. The LER in the dot pattern is defined as the roughness in an outer peripheral direction, which is an extending direction of the pattern, that is, the roughness of a side wall of a dot. The LER in the pattern having holes is defined as the roughness in an inner peripheral direction of the hole, which is an extending direction of the pattern, that is, the roughness of an inner wall of the hole.

As shown in FIG. 3A, in the purified water supply unit 40, purified water is supplied to the substrate SB on which the resist pattern RP as described above is formed. Further, the substrate SB is held on the hot plate 41 at a predetermined temperature for a predetermined time while substrate SB is covered with the purified water. The temperature at this time may be, for example, about 80° C. In addition, a holding time may be 15 minutes or more and 180 minutes or less, for example, 30 minutes.

It has been found that when the convex portion of the resist pattern RP is removed by using the near-field light described below, a reaction proceeds not only due to purified water existing outside the resist pattern RP but also due to purified water impregnated inside the resist pattern RP. As described above, impregnation of purified water into the resist pattern RP can be promoted by maintaining the purified water on the substrate SB for a predetermined time at a predetermined temperature.

As shown in FIG. 3B, in the light irradiation unit 50, the light LT is irradiated onto the substrate SB covered with purified water. An irradiation time of the light LT onto the substrate SB is 15 minutes or more and 180 minutes or less, and may be, for example, 30 minutes.

As a result of the irradiation, the near-field light NFL is generated on a fine convex portion of the resist pattern RP. Further, water molecules of purified water existing in the vicinity of the convex portion of the resist pattern RP are dissociated as follows by the energy of the near-field light NFL. The water molecules in the vicinity of the convex portion of the resist pattern RP also include water molecules impregnated inside the resist pattern RP.

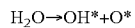

$H_2O \rightarrow OH^* + O^*$

In active species dissociated as described above, mainly OH* causes a chemical reaction with the resist material forming the convex portion of the resist pattern RP. As described above, the near-field light rapidly attenuates according to a distance from the convex portion. For this reason, mainly the convex portion of the resist pattern RP is selectively removed.

As shown in FIG. 3C, the resist pattern RP whose convex portion is removed and whose LER is reduced is obtained.

As described above, a photochemical reaction using the energy of the near-field light is promoted by performing the above processing in the predetermined gas atmosphere under a reduced pressure. Specifically, it is considered that the photochemical reaction is promoted by decreasing a partial pressure of nitrogen, which is an inert gas, lower than a partial pressure in the atmosphere and increasing a partial pressure of oxygen, which is more active. In addition, the stage 51 on which the substrate SB is placed is configured to be able to adjust the temperature, and the chemical reaction between purified water and the resist material is further promoted by holding the temperature of the substrate SB at, for example, about 80° C.

Thereafter, the substrate SB is etched using the resist pattern RP whose side walls are smoothed and whose LER is improved as a mask. As a result, the template having the fine pattern is obtained.

Figure 4:
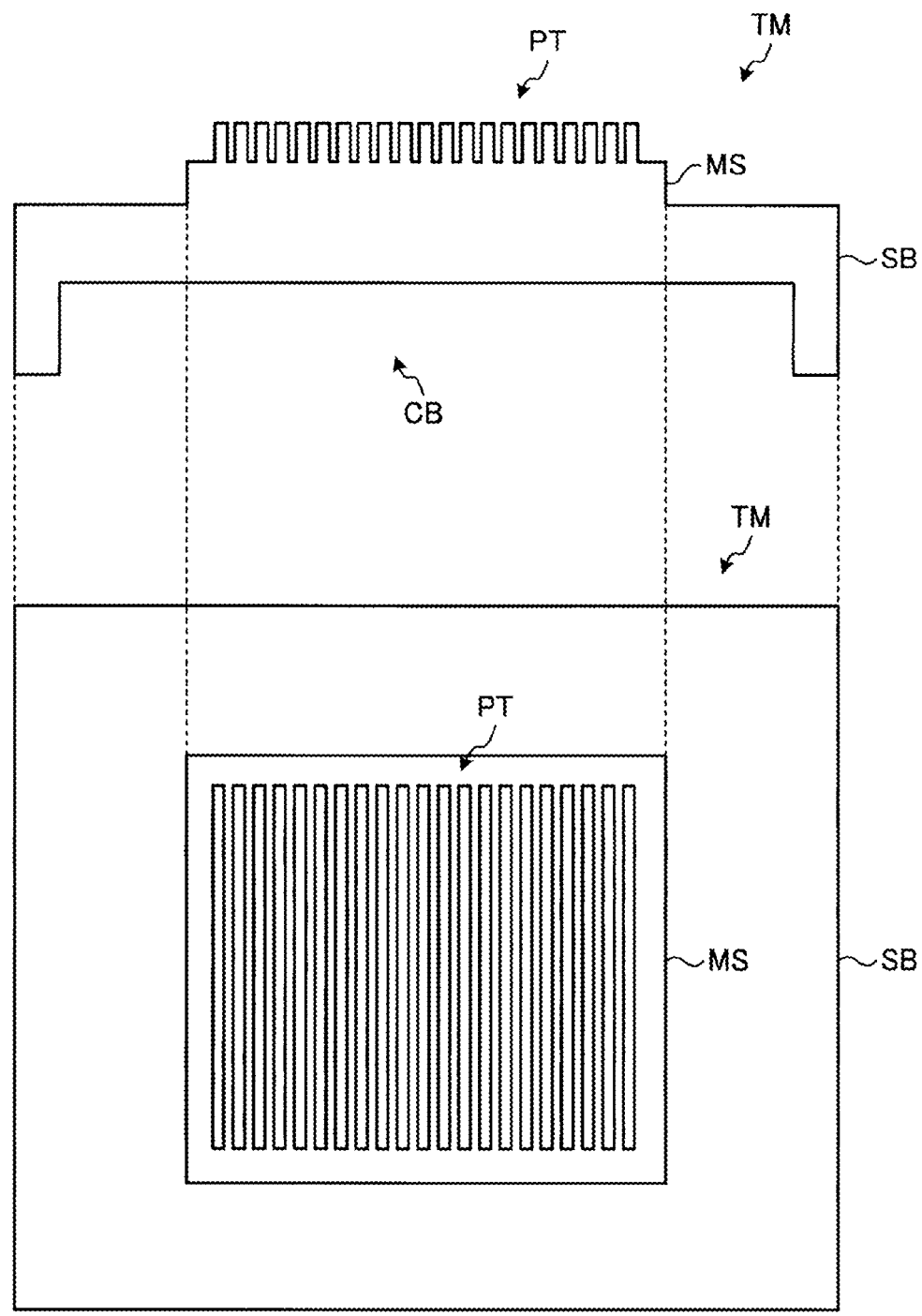
FIG. 4 is a schematic diagram showing an example of a configuration of a template according to an embodiment.

FIG. 4 is a schematic diagram showing an example of a configuration of a template TM according to the embodiment. FIG. 4A is a longitudinal sectional view of the template TM, and FIG. 4B is a plan view of the template TM.

As shown in FIG. 4, the template TM includes the substrate SB including a mesa portion MS on a front surface and a counterbore CB on a back surface of the substrate SB. The mesa portion MS and the counterbore CB of the substrate SB are formed by machining or the like before the above resist pattern RP or the like is formed.

On the mesa portion MS, the fine pattern PT formed using the resist pattern RP as the mask is disposed. The fine pattern PT is a low LER pattern that follows the LER of the resist pattern RP and has a relatively smooth side wall. As an example, the fine pattern PT has, for example, a pattern having a half pitch of more than ten and less than twenty nanometers, and has an LER is several nanometers or less by 3σ.

(Substrate Processing Method)

Figure 5:
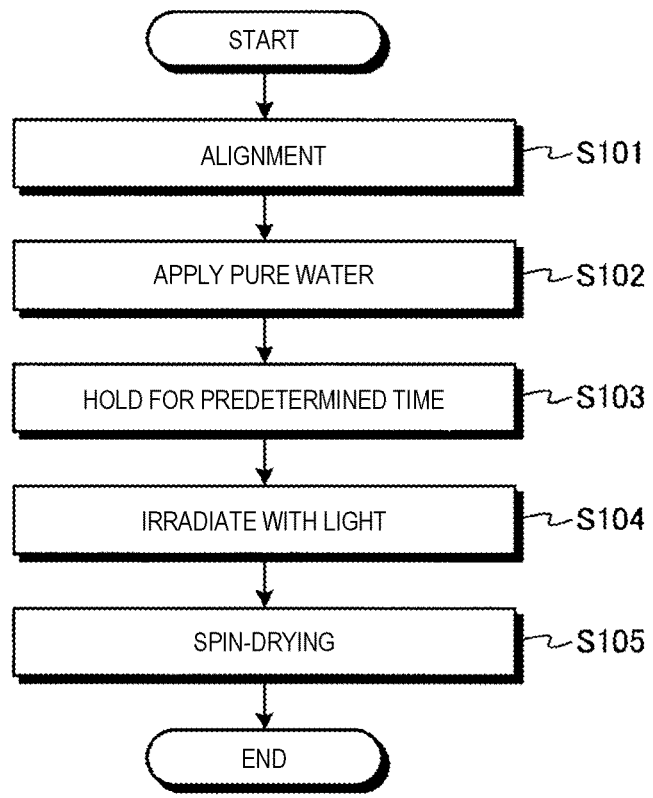
FIG. 5 is a flowchart showing an example of a procedure of a substrate processing method according to an embodiment.

Next, a substrate processing method in the substrate processing apparatus 1 will be described with reference to FIG. 5. FIG. 5 is a flowchart showing an example of a procedure of the substrate processing method according to the embodiment.

As shown in FIG. 5, the substrate SB is aligned in the alignment chamber 30 (step S101).

More specifically, the substrate SB on which the resist pattern RP is formed is stored in the storage container 11, and the storage container 11 is placed on the cassette unit 10. The transfer arm 23 of the transfer unit 20 picks up the substrate SB in the storage container 11 and places the substrate SB on the stage 31 in the alignment chamber 30.

In the alignment chamber 30, the stage 31 on which the substrate SB is placed moves in the X and/or Y directions while the irradiation device emits the laser light, so that the laser light will be reflected by the substrate SB and the outer edge portion of the substrate SB can be detected. The control unit 70 adjusts a position of the stage 31 such that the substrate SB is on a predetermined position based on information on the location of the outer edge portion of the detected substrate SB. As a result, the substrate SB, which is picked up again by the transfer arm 23, can be transferred to a correct position in each unit of the purified water supply unit 40, the light irradiation unit 50, and the drying unit 60.

Next, purified water is applied to the substrate SB by the purified water supply unit 40 (step S102).

More specifically, the transfer arm 23 of the transfer unit 20 picks up the substrate SB which is in the alignment chamber 30, and places the substrate SB on the hot plate 41 of the purified water supply unit 40. Further, purified water is supplied from the nozzle 42 onto the substrate SB which is adjusted to the predetermined temperature by the hot plate 41. As a result, the substrate SB enters a liquid covered state.

Thereafter, the substrate SB is held on the hot plate 41 at a predetermined temperature for a predetermined time (step S103). During this time, it is considered that the impregnation of purified water into the resist pattern RP (which is formed on the substrate SB) occurs.

Next, the substrate SB is irradiated with the light LT for a predetermined time by the light irradiation unit 50 (step S104).

More specifically, the transfer arm 23 of the transfer unit 20 picks up the substrate SB which is in the purified water supply unit 40, and places the substrate SB on the stage 51 of the light irradiation unit 50. At this time, even if purified water is spilled from the substrate SB that is presently covered with purified water, the spilled purified water is quickly discharged out of the substrate processing apparatus 1 by the tray 24 provided on the floor in the transfer unit 20 and the discharge pipe 25. In addition, purified water spilled in the light irradiation unit 50 is quickly discharged out of the substrate processing apparatus 1 through the discharge paths 54 and the discharge pipe 55.

In the light irradiation unit 50, the pump 58 is operated to reduce the pressure in the light irradiation unit 50, and the valve 57 of the gas supply pipe 56 is opened to supply the predetermined gas into the light irradiation unit 50. Further, the inside of the light irradiation unit 50 is adjusted to a predetermined pressure by adjusting the supply amount of the gas and an opening degree of the butterfly valve at this time.

In this state, the light LT is irradiated from the illumination device 53. The light LT from the illumination device 53 passes through the window 52 of the light irradiation unit 50 and is irradiated onto the substrate SB on the stage 51.

As a result, the convex portion of the resist pattern RP on the substrate SB is removed by the chemical reaction with OH* dissociated by the energy of the near-field light. At this time, the temperature of the substrate SB may be kept at the predetermined temperature by providing the stage 51 with a temperature control function.

When the predetermined time has elapsed, the irradiation of the light LT performed by the illumination device 53 is ended. Further, the valve 57 of the gas supply pipe 56 is closed and the pump 58 is stopped.

Next, the substrate SB is spin-dried by the drying unit 60 (step S105).

More specifically, the transfer arm 23 of the transfer unit 20 picks up the substrate SB which is in the light irradiation unit 50, and places the substrate SB on the spinner 61 of the drying unit 60. At this time, even if purified water is spilled from the substrate SB that is covered with purified water, the spilled purified water is quickly discharged out of the substrate processing apparatus 1 by the tray 24 provided on the floor in the transfer unit 20 and the discharge pipe 25.

The substrate SB placed on the spinner 61 is fixed by the chuck 62. In this state, the spinner 61 spins at the high speed, and purified water on the substrate SB is scattered by a centrifugal force, whereby the substrate SB is spin-dried.

Thus, substrate processing in the substrate processing apparatus 1 of the embodiment is ended. Thereafter, the substrate SB may be more reliably dried by placing the substrate SB under the reduced pressure and holding the substrate SB at the predetermined temperature. Purified water impregnated in the resist pattern RP can also be removed.

COMPARATIVE EXAMPLE

In a substrate processing method of a comparative example, in order to improve LER of a resist pattern, the performance of electron beam drawing is improved or a resist material is improved. However, for example, for a resist pattern having a nano-order pattern, these improvement measures have limitations.

As described above, there is a technique for removing a convex portion of a predetermined member by the chemical reaction using the energy of the near-field light. In that case, the dissolution solution or the like of, for example, halogen-based gas or chlorine is used as the reactive substance to react with a member to be smoothed. However, when such a technique is applied to the fine resist pattern formed by the electron beam drawing or the like, portions other than the convex portion is affected by the reactive substance and the resist pattern may be damaged, such as a change in pattern size.

According to the substrate processing method of the embodiment, the chemical reaction is caused by using purified water for the resist pattern RP. The resist material and purified water do not cause a fast chemical reaction. That is, purified water has no reactivity or has only a very low reactivity with the resist material. The convex portion of the resist pattern RP can be selectively removed by using such a liquid. As a result, the LER can be improved by smoothing the side wall of the resist pattern RP.

According to the substrate processing method of the embodiment, the substrate SB, on which purified water has been placed, is held at the predetermined temperature for the predetermined time, which accelerates the impregnation of purified water into the resist pattern RP on the substrate SB. Purified water impregnated in the resist pattern RP contributes to the chemical reaction with the resist material which uses the near-field light, and can further promote the removal of the convex portion of the resist pattern RP.

According to the substrate processing method of the embodiment, the light LT is irradiated onto the substrate SB under the reduced pressure. As a result, the partial pressure of nitrogen is lower than that in the atmosphere, and the partial pressure of oxygen is relatively increased. The chemical reaction due to the near-field light can be promoted by irradiating the light LT in such an atmosphere.

The substrate processing apparatus 1 of the embodiment includes the purified water supply unit 40 which can hold the substrate SB, on which purified water has been placed, at the predetermined temperature for the predetermined time. According to the purified water supply unit 40, the impregnation of purified water into the resist pattern RP can be promoted.

According to the substrate processing apparatus 1 of the present embodiment, the light irradiation unit 50 that emits the light under the reduced pressure onto the substrate SB supplied with purified water is provided. Accordingly, the partial pressure of nitrogen in the light irradiation unit 50 can be decreased, and the chemical reaction between the resist material and OH* due to the near-field light can be promoted.

According to the substrate processing apparatus 1 of the present embodiment, the light irradiation unit 50 includes the discharge paths 54 and the discharge pipe 55. Accordingly, pure water spilled in the light irradiation unit 50 can be quickly discharged via the discharge paths 54 and discharge pipe 55, and the pressure in the light irradiation unit 50 can be kept constant.

According to the substrate processing apparatus 1 of the embodiment, the transfer unit 20 includes the tray 24 and the discharge pipe 25. Accordingly, when the substrate SB, on which purified water has been placed, is transferred, the purified water spilled from the substrate SB can be quickly discharged out of the substrate processing apparatus 1 via the discharge pipe 25.

According to a template TM of the embodiment, a convex portion can be removed by the chemical reaction between OH* generated by dissociation of purified water and the resist material, and the fine pattern PT can be formed using a resist pattern RP having improved LER as the mask. As a result, a fine pattern PT with lower LER can be obtained. In addition, such a fine pattern PT can be further transferred to the resist film on a wafer or other substrate, such as a semiconductor substrate, whereby the wafer or substrate can be processed with an improved accuracy.

(Modification)

Next, a substrate processing method according to a modification of the embodiment will be described with reference to FIG. 6. The substrate processing method according to the modification is different from the above embodiment in that the substrate SB is not covered with purified water at the time the light LT is irradiated on to the substrate SB. The substrate processing method according to the modification can also be performed in or by the substrate processing apparatus 1 of the above-described embodiment.

Figure 6:
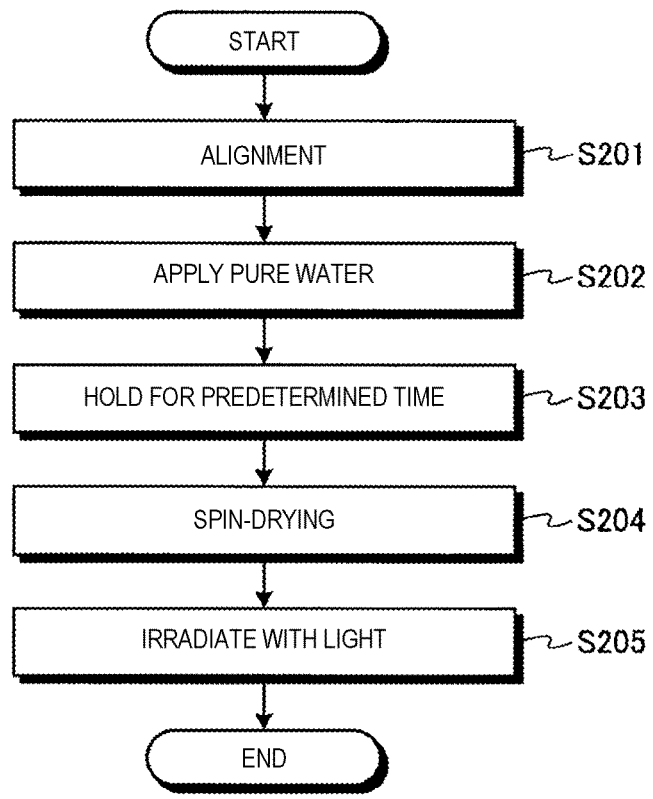
FIG. 6 is a flowchart illustrating an example of a procedure of a substrate processing method according to a modification of an embodiment.

FIG. 6 is a flowchart showing an example of a procedure of the substrate processing method according to the modification of the embodiment. As shown in FIG. 6, processing from step S201 to S203 is performed with the same method as processing from step S101 to S103 in FIG. 5.

In step S203, the substrate SB that is covered with purified water is held at a predetermined temperature for a predetermined time, and then the substrate SB is spin-dried by the drying unit 60 (step S204).

More specifically, the transfer arm 23 of the transfer unit 20 picks up the substrate SB, which is in the purified water supply unit 40, and places the substrate SB on the spinner 61 of the drying unit 60. The substrate SB that is placed on the spinner 61 is fixed by a chuck 62. In this state, the spinner 61 spins at a high speed, and purified water on the substrate SB is scattered by the centrifugal force, whereby the substrate SB is spin-dried.

Next, the substrate SB is irradiated with the light LT for the predetermined time by the light irradiation unit 50 (step S205).

More specifically, the transfer arm 23 of the transfer unit 20 picks up the substrate SB, which is in the drying unit 60, and places the substrate SB on the stage 51 of the light irradiation unit 50. The light irradiation unit 50 is depressurized (evacuated) by the pump 58, and the valve of the gas supply pipe 56 is opened to supply a predetermined gas. The light LT is emitted from the illumination device 53 onto the substrate SB on the stage 51.

Here, a surface of the substrate SB which has been spin-dried by the drying unit 60 is in a state where purified water is substantially removed from the surface thereof. However, impregnated purified water can remain inside the resist pattern RP on the substrate SB. As a result, even though the substrate SB is not presently entirely covered with purified water, purified water that is still left in the resist pattern RP can dissociate OH* when exposed to the near-field light, and the chemical reaction proceeds between OH* and the resist material of the convex portion. As a result, the convex portion of the resist pattern RP can be removed, and accordingly the LER of the resist pattern RP can be reduced.

When the predetermined time has elapsed, the irradiation of the light LT from the illumination device 53 is ended, the valve 57 of the gas supply pipe 56 is closed, and the pump 58 is stopped.

Thus, substrate processing according to the modification of the embodiment is ended. Thereafter, additional drying may be performed by placing the substrate SB under reduced pressure and holding the substrate SB at a predetermined temperature.

According to the substrate processing method of the modification, the same effects as those of the above embodiment can be obtained.

According to the substrate processing apparatus 1 of the modification, after purified water is supplied to the substrate SB by the purified water supply unit 40, the substrate SB is then transferred to the drying unit 60 and is spin-dried. Then spin-dried substrate SB is transferred to the light irradiation unit 50 for irradiation. For that reason, a transfer area for the substrate SB with water thereon becomes shorter. As a result, spilling of purified water from the substrate SB can be reduced, and the inside of the substrate processing apparatus 1 can be kept cleaner/drier. In addition, overall handling of the substrate SB is facilitated.

In the above embodiment and the like, it is described as OH* from among the dissociated active species contributes to the chemical reaction with the resist material, but the present disclosure is not limited thereto. For example, it may be considered that O* from among the dissociated active species may contribute to the chemical reaction with the resist material in some embodiments.

In addition, in the above description, the LER of the resist pattern RP that has been formed on a quartz substrate SB is reduced, but the present disclosure is not limited to this. For example, LER of a resist pattern formed on a semiconductor wafer or the like or indeed any pattern on any substrate type may be improved by such processing and apparatus. As particular examples, in addition to a quartz substrate as described above, a silicon substrate or a sapphire substrate may be used as a substrate.

In addition, in the above embodiment and the like, purified water is dissociated to cause the chemical reaction with a convex portion of the resist pattern RP, but the present disclosure is not limited to this. A liquid other than purified water may be used as long as the liquid does not cause a chemical reaction with a member to be smoothed without photo-excitation. By using the liquid with low reactivity in a normal state, the convex portion of the member can be selectively removed to reduce the LER.

Here, when the member to be smoothed is a resin material, such as a resist pattern, the liquid is preferably a liquid having a molecular size smaller than a free volume of the resin material. The free volume is defined in this context as a volume when a gap of the resin material constantly moving at the molecular level is widened to the maximum. That is, the liquid is preferably a liquid having a molecular size permitting the liquid molecules to be impregnated into the resin material. According to the molecular size, the chemical reaction between the liquid dissociated by the energy of the near-field light and the resin material is promoted.

EXAMPLES

Next, certain examples will be described with reference to FIGS. 7 and 8.

Example 1

A chromium film was formed on a quartz substrate, and a resist film having a thickness of 500 nm was formed on the chromium film to prepare samples. The resist film was a solid film having no pattern or the like. Prepared samples were processed by an apparatus having the same configuration as the substrate processing apparatus 1 of the above embodiment.

A first sample was supplied with purified water by the above apparatus to be covered with purified water, and the substrate was held for 30 minutes in this state (covered with the purified water). Thereafter, light irradiation was performed for 30 minutes using a white LED. The illuminance at this time was 30,000 lux at a distance of 50 cm. Thereafter, purified water was removed from the sample by spin-drying. The above sample is a sample of Example 1.

A second sample was processed with the same method as the sample of Example 1 except that no light irradiation was performed. That is, the second sample was supplied with purified water by the above apparatus to be covered with purified water, and this state was held for 30 minutes. Thereafter, purified water was removed from the sample by spin-drying. The above sample is a sample of the comparative example.

A third sample was not processed with either purified water supply or light irradiation. That is, a state after sample preparation was maintained without additional processing. The sample is corresponding to an initial state sample.

For these three samples, the surface roughness was measured using an atomic force microscope (AFM). FIG. 7 shows a value of the surface roughness represented by root mean square (RMS) values.

Figure 7:
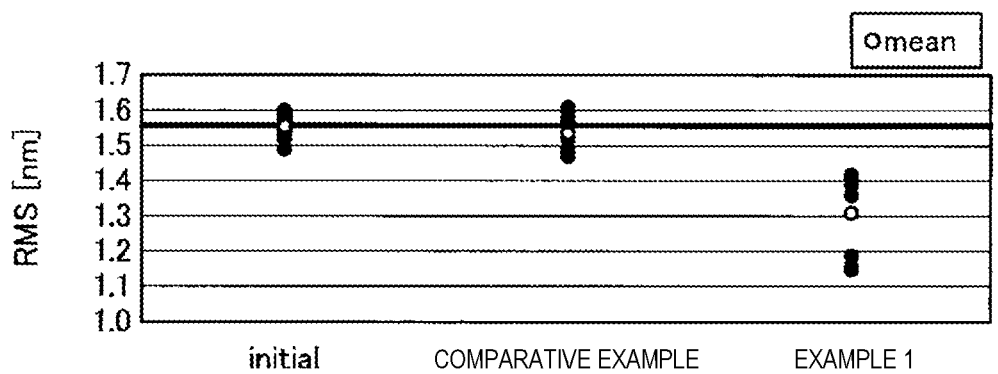
FIG. 7 is a graph showing the surface roughness of resist films by RMS (root mean square) values according to Example 1 and a comparative example.

FIG. 7 is a graph showing the surface roughness of resist films in RMS according to Example 1 and the comparative example. A horizontal axis of the graph represents each sample, and a vertical axis represents RMS (nm). As shown in FIG. 7, the RMS of the initial state sample was 1.56 nm, the RMS of comparative example was 1.54 nm, and the RMS of Example 1 was 1.31 nm.

In comparative example in which purified water was only applied and impregnated, the surface roughness of the resist film was hardly changed from the initial state sample. From this result, it can be found that no meaningful chemical reaction occurred between just purified water and the resist material.

In the sample of Example 1, a reduction in the RMS value of about 0.25 nm was observed with respect to initial state sample. From this result, it was found that the surface roughness of the resist film was improved by irradiating resist film with light while it was covered with the purified water.

Example 2

A chromium film was formed on a quartz substrate, and a resist film having a thickness of 500 nm was formed on the chromium film to prepare samples similar to the above. The prepared samples were processed by an apparatus having the same configuration as the substrate processing apparatus 1 of the above embodiment.

One sample was processed in the same method as in Example 1 by changing the order. That is, the first sample was supplied with purified water by the above apparatus to be in a liquid filling state, and the liquid filling state was held for 30 minutes. Thereafter, purified water was removed from the sample by spin-drying. Thereafter, light irradiation was performed for 30 minutes using a white LED. The illuminance at this time was 30,000 lux at a distance of 50 cm. The above sample is a sample of Example 2.

The surface roughness of the sample of Example 2 was measured using an AFM. FIG. 8 shows a value representing the surface roughness by RMS values.

Figure 8:
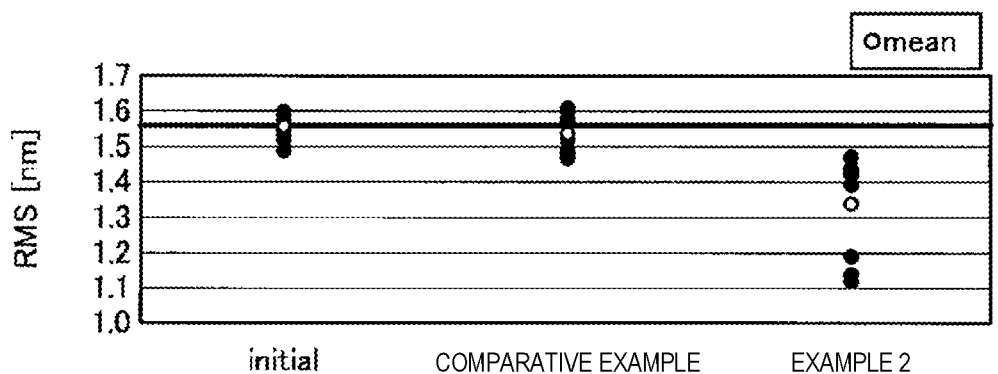
FIG. 8 is a graph showing the surface roughness of resist films by RMS values according to Example 2 and a comparative example.

FIG. 8 is a graph showing the surface roughness of resist films by RMS according to Example 2 and a comparative example. A horizontal axis of the graph represents each sample, and a vertical axis represents RMS (nm). Samples similar to those described above were used as the samples of initial state sample and a comparative example. As shown in FIG. 8, the RMS of initial state sample was 1.56 nm, the RMS of comparative example was 1.54 nm, and the RMS of Example 2 was 1.34 nm.

In the sample of Example 2, a reduction in the RMS value of about 0.22 nm was observed with respect to Initial. From this result, it was found that by covering the sample (Example 2) with purified water for 30 minutes, the resist film becomes impregnated with purified water, and this purified water retained in the resist film contributes to a chemical reaction of the resist material when exposed to near-field light.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for processing a substrate, comprising:
forming a pattern on a substrate;
supplying a liquid consisting of purified water or carbonated water to cover the pattern; and
after supplying the liquid, irradiating the pattern with a light through the liquid, the light causing near-field light to be generated selectively around uneven portions of the pattern, the generated near-field light causing active species to be generated from the liquid around the pattern and planarization of the pattern with the generated active species,
wherein the light has a wavelength that does not cause dissociation of water molecules.

2. The method according to claim 1, wherein the pattern is irradiated while the pattern is covered with the liquid.

3. The method according to claim 1, further comprising:
removing the liquid on the pattern after irradiating the pattern with the light.

4. The method according to claim 1, wherein the liquid is carbonated water.

5. The method according to claim 1, wherein the pattern is a resist pattern.

6. The method according to claim 1, wherein the liquid is purified water.

7. The method according to claim 1, further comprising:
spin-drying the substrate after irradiating the pattern with the light.

8. The method according to claim 1, wherein a specific resistance value of the liquid at 23° C. is in a range of 0.1 MWcm or more and 1.0 MWcm.

9. The method according to claim 8, wherein the liquid is carbonated.

10. The method according to claim 1, wherein the pattern has a lower line edge roughness after the irradiating of the pattern than before the irradiating of the pattern.

11. The method according to claim 1, wherein the pattern is irradiated using an illumination device outputting light with a wavelength greater than 258 nm.

12. The method according to claim 1, wherein the pattern is irradiated with a near-field exposure device outputting a wavelength longer than 258 nm.

13. The method according to claim 1, wherein the pattern is irradiated in a chamber in which a pressure is less than atmospheric pressure.

14. The method according to claim 1, wherein
the liquid is supplied in a first chamber and the pattern is irradiated in a second chamber.

15. The method according to claim 1, wherein a half pitch of the pattern is greater than 10 nm.

16. The method according to claim 1, wherein the pattern has a convex portion and the convex portion is removed by said irradiating the pattern with the light through the liquid.

17. The method according to claim 1, wherein the light is white light emitted from an LED.

18. A substrate processing apparatus, comprising:
a transfer chamber configured to receive a substrate having a pattern formed thereon;
a liquid supply chamber configured to cover the pattern with a liquid consisting of purified water or carbonated water; and an irradiation chamber configured to irradiate the pattern with light having a wavelength longer than a wavelength that causes dissociation of water molecules, the light causing near-field light to be generated selectively around uneven portions of the pattern, the generated near-field light causing active species to be generated from the liquid around the pattern and planarization of the pattern with the generated active species.

19. The substrate processing apparatus according to claim 18, further comprising:
a spin-drying apparatus configured to spin dry the substrate.

20. The substrate processing apparatus according to claim 19, wherein the transfer chamber includes a transfer arm configured to convey the substrate from the liquid supply chamber to the irradiation chamber and from the irradiation chamber to the spin-drying apparatus.

21. The substrate processing apparatus according to claim 19, wherein the transfer chamber includes a transfer arm configured to convey the substrate from the liquid supply chamber to the spin-drying apparatus and from the spin-drying apparatus to the irradiation chamber.

22. The substrate processing apparatus according to claim 18, further comprising:
an alignment chamber configured to receive the substrate from the transfer chamber and determine an edge position of the substrate using light.

23. The substrate processing apparatus according to claim 18, wherein the liquid is purified water.

24. The substrate processing apparatus according to claim 18, wherein the liquid is carbonated water.

25. The substrate processing apparatus according to claim 18, wherein the transfer chamber includes a transfer arm configured to convey the substrate from the liquid supply chamber to the irradiation chamber.

26. The substrate processing apparatus according to claim 18, the transfer chamber includes a tray and a pipe configured to discharge liquid that flows from the liquid supply chamber and the irradiation chamber into the transfer chamber out of the transfer chamber.

* * * * *